US010630174B2

(12) United States Patent
Couleur et al.

(10) Patent No.: US 10,630,174 B2
(45) Date of Patent: *Apr. 21, 2020

(54) TRANSIENT EVENT DETECTOR CIRCUIT AND METHOD

(71) Applicant: Texas Instruments Incorporated, Dallas, TX (US)

(72) Inventors: Michael Couleur, Munich (DE); Neil Gibson, Freising (DE); Antonio Priego, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/225,771

(22) Filed: Dec. 19, 2018

(65) Prior Publication Data

US 2019/0123641 A1    Apr. 25, 2019

Related U.S. Application Data

(63) Continuation of application No. 15/284,262, filed on Oct. 3, 2016, now Pat. No. 10,199,929.

(51) Int. Cl.
| | | |
|---|---|---|
| *H02M 3/07* | (2006.01) | |
| *H03L 5/02* | (2006.01) | |
| *H03L 7/089* | (2006.01) | |
| *H03L 7/081* | (2006.01) | |
| *H02M 3/158* | (2006.01) | |
| *H02M 1/14* | (2006.01) | |

(52) U.S. Cl.
CPC ............... *H02M 3/07* (2013.01); *H03L 5/02* (2013.01); *H03L 7/089* (2013.01); *H03L 7/0812* (2013.01); *H03L 7/0891* (2013.01); *H02M 1/14* (2013.01); *H02M 3/158* (2013.01)

(58) Field of Classification Search
CPC .......... H02M 1/14; H02M 3/07; H02M 3/157; H02M 3/158
See application file for complete search history.

(56) References Cited

U.S. PATENT DOCUMENTS 4,516,042 A    5/1985   Nakamura
5,157,354 A *  10/1992  Saiki ................. G11B 20/1403
                                                    331/1 A (Continued)

OTHER PUBLICATIONS

Notification of Transmittal of the International Search Report and the Written Opinion of the International Searching Authority, or Declaration; dated Jan. 31, 2018; 7 pages.

(Continued)

*Primary Examiner* — Jue Zhang
*Assistant Examiner* — Lakaisha Jackson
(74) *Attorney, Agent, or Firm* — Tuenlap Chan; Charles A. Brill; Frank D. Cimino

(57) ABSTRACT

Disclosed examples include a transient event detector circuit to detect transient events in a switching converter, including a DLL circuit to detect changes in a duty cycle of a pulse width modulation signal used to operate a switching converter, and an output circuit to provide a status output signal in a first state when no transient event is detected, and to provide the status output signal in a second state indicating a transient event in the switching converter in response to a detected change in the duty cycle of the pulse width modulation signal.

20 Claims, 6 Drawing Sheets

(56) References Cited

U.S. PATENT DOCUMENTS

| | | | |
|---|---|---|---|
| 8,816,656 | B2 | 8/2014 | Couleur et al. |
| 8,829,874 | B2 | 9/2014 | Gibson |
| 10,199,929 | B2* | 2/2019 | Couleur ............... H02M 3/07 |
| 2003/0185025 | A1 | 10/2003 | Takemura et al. |
| 2007/0075785 | A1* | 4/2007 | Kossel ................ H03L 7/089 |
| | | | 331/16 |
| 2010/0127680 | A1 | 5/2010 | Satterfield et al. |
| 2014/0021930 | A1 | 1/2014 | Liu et al. |
| 2015/0029760 | A1 | 1/2015 | Karlsson et al. |
| 2015/0160669 | A1 | 6/2015 | Marschalkowski et al. |
| 2015/0188406 | A1 | 7/2015 | Nishi et al. |
| 2016/0061171 | A1 | 3/2016 | Fryc et al. |
| 2016/0109488 | A1* | 4/2016 | Dearborn ............ H02M 3/156 |
| | | | 324/76.11 |
| 2017/0025952 | A1 | 1/2017 | Huang |

OTHER PUBLICATIONS

Texas Instruments, TPS6303x High Efficiency Single Inductor Buck-Boost Converter With 1-A Switches; Oct. 2008; Revised Oct. 2015; 26 pages.

\* cited by examiner

TRANSIENT EVENT DETECTOR CIRCUIT AND METHOD

CROSS REFERENCE TO RELATED APPLICATIONS

Under 35 U.S.C. § 120, this continuation application claims benefits of priority to U.S. patent application Ser. No. 15/284,262 (TI-76213), filed on Oct. 3, 2016, the entirety of which is hereby incorporated herein by reference.

BACKGROUND

Switching converters are used to convert electrical power from one form to another by operation of a switching circuit. Examples include DC-DC switching converters with switch circuits to convert DC input power into a controlled DC output to drive a load. Single-phase systems include a single switching converter to drive the load. Multiphase systems include two or more switching converters connected in parallel with one another to provide a regulated output voltage, with the ability to activate or deactivate certain switching converters depending on load current requirements. In single or multiphase switching converter systems, it is desirable to react to transient conditions, such as line or load variations. For example, changes in load current requirements may allow one or more phases to be turned off or disabled to enhance overall system energy efficiency. Other changing conditions may require activation of one or more phases to accommodate increased load current requirements. Changing input power conditions, such as variations in input voltage levels can likewise be accommodated by selectively activating or deactivating phases of a multiphase system. Using parallel inductors at the outputs of individual switching converter phases can improve transient response, but this might lead to energy inefficiencies in steady state operation. It is then a great advantage to detect as fast as possible the transient event and to know when the system went back to steady state. Transient events are typically short and detecting certain events requires very high-speed circuitry, leading to cost and energy efficiency challenges in switching converter design. Enhanced efficiency and intelligent phase management can be facilitated by fast detection of transient events and also fast notification that the system has returned to steady state operation.

SUMMARY

Disclosed examples include power conversion systems, integrated circuits and transient event detector circuits to detect transient events in switching converters. The transient event detector circuit in certain examples includes a delay lock loop (DLL) circuit to detect changes in a duty cycle of a pulse width modulation (PWM) signal used to operate a switching converter. The detector circuit provides a status output signal in a first state when no transient event is detected. The detector circuit provides the status output signal in a second state indicating a transient event in the switching converter in response to a detected change in the duty cycle of the PWM signal. The DLL circuit in one example includes a monostable multivibrator to generate a pulse output signal triggered by a first edge of the PWM signal, as well as a phase detector to provide first and second output signals according to a phase difference between the second edge of the PWM signal and a controlled edge of the multivibrator pulse output signal. A charge pump selectively sources or sinks current to or from a capacitor according to the phase detector outputs to establish a voltage control signal. The capacitor provides the voltage control signal as a control input to the multivibrator to align the second edges of the multivibrator pulse output and PWM signals. In certain examples, the DLL circuit has a bandwidth equal to the bandwidth of a control circuit operating the switching converter so that both systems are over-slewed for the same type of transient events. This facilitates detection that a previous steady state duty cycle has changed within the PWM cycle in which the change occurs. Fast transient detection, in turn, facilitates timely intelligent adjustments in single and/or multiphase switching converter systems, such as selectively activating or deactivating one or more phases in a multiphase system. In certain examples, the transient event detector circuit filters the phase detector output signals, and generates the status output signal according to the filtered phase detector signals. The first and second filtered phase detector signals can also be provided as output signals to distinguish between positive and negative transient events. The transient event detector circuit in certain examples is provided in a switching controller integrated circuit (IC) along with a control circuit to operate the switching converter. In other examples, the transient event detector circuit is integrated with a multiphase converter master controller that receives PWM signals from one or more individual switching converter control circuits to identify a load and/or line transient event based on changes in PWM signal duty cycle.

DETAILED DESCRIPTION

Figure 1:
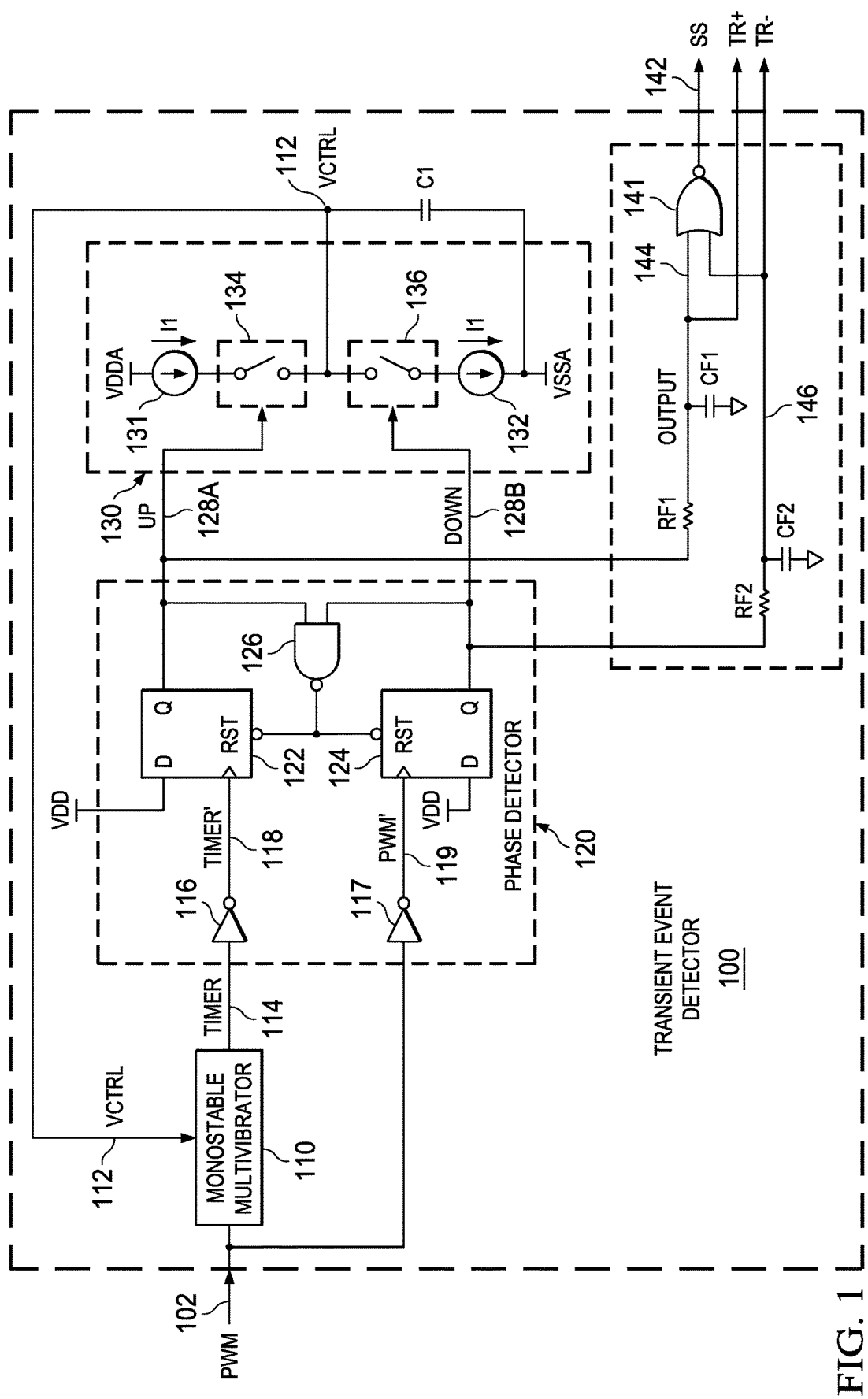
FIG. 1 is a schematic diagram of a transient event detector circuit with a DLL to detect changes in a PWM signal duty cycle.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ". Also, the terms "couple", "couples", or "coupled" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a transient event detector circuit 100 including an input 102 that receives a first signal PWM from a switching converter control circuit, referred to herein as a pulse width modulation signal PWM. The transient event detector circuit 100 also includes signal outputs 142, 144 and 146 that provide a status output signal SS, a positive transient signal TR+ and a negative transient signal TR−, respectively. The circuit 100 can be used in any form of power conversion system that includes one or more switching converter stages to convert power from one form to another. Disclosed examples are illustrated and described below in connection with DC-DC switching converters, although the concepts of the present disclosure are not limited to the illustrated examples. In operation, the switching converter operates according to the PWM signal, and the circuit 100 quickly detects that a previous steady state duty cycle of the PWM signal has changed within the cycle in which the change occurs. The circuit 100 provides a solution to quickly identify transient events at the input and/or output of a switching converter, allowing timely intelligent responsive measures. For example, one or more of the outputs SS, TR+ and TR− can be used by converter control circuitry for intelligent load management for enabling or disabling individual switching converter phases in a multiphase power conversion system in response to a line or load transient event.

The transient event detector circuit 100 includes a delay lock loop (DLL) circuit formed by a monostable multivibrator circuit 110, a phase detector circuit 120 and a charge pump circuit 130. The received first signal PWM can be generated by any suitable source, such as control circuitry operating a DC-DC converter circuit. The signal PWM has a rising edge, a falling edge, and a duty cycle representing an on time of a switching device of the associated switching converter in a given converter switching cycle. The monostable multivibrator circuit 110 includes a signal input 102 that receives the signal PWM, and an output 114 that generates a pulse output signal TIMER with a first edge triggered by a first edge of the PWM signal. In the illustrated example, the monostable multivibrator circuit 110 provides the output pulse signal TIMER having a rising edge triggered by the rising edge of the PWM signal. The second (e.g., falling) edge of the pulse output signal TIMER is controlled by a voltage control signal VCTRL received at a control input 112 of the multivibrator 110.

The phase detector circuit 120 includes a first input inverter 116 that receives the TIMER signal and provides an inverted signal TIMER' at an output 118. A second inverter 117 is provided at a second input of the phase detector 120. The inverter 117 receives the PWM signal and provides an inverted signal PWM' at an output 119. The phase detector 120 includes first and second outputs 128A and 128B to provide first and second output signals UP and DOWN according to a phase difference between the second edge of the PWM signal and the controlled second edge of the multivibrator pulse output signal TIMER. The output 118 of the inverter 116 provides the inverted signal TIMER' to a clock input of a first data (D) flip-flop 122. A second D flip-flop 124 has a clock input that receives the inverted first signal PWM'. The data inputs "D" of the flip-flops 122 and 124 are connected to a supply voltage VDD (logic high in this example). The output 128A of the first flip-flop 122 ("Q" flip-flop output) provides a first phase detector output signal UP in a first state (e.g., high) in response to the falling edge of the output pulse signal TIMER. The "Q" output of the second flip-flop 124 is connected to a second output 128B of the phase detector 120. The output 128B provides a second phase detector output signal DOWN in a first state (e.g., high) in response to the falling edge of the first signal PWM. The flip-flops 122 and 124 in FIG. 1 are reset by the active low output of a NAND gate 126, whose inputs are connected to the flip-flop outputs 128A and 128B.

In this configuration, the phase detector 120 provides an UP signal in an active first state (high) in response to the falling edge (second edge) of the PWM signal lagging the falling edge of the TIMER signal. The UP signal in this example has a rising edge triggered by the falling edge of the TIMER signal, and a falling edge triggered by the receipt of a lagging PWM signal falling edge. The phase detector 120 provides the DOWN signal in this example in an active (high) first state in response to the falling edge of the PWM signal leading the falling edge of the TIMER signal. The resulting DOWN signal has a rising edge triggered by the falling edge of the PWM signal, and a falling edge triggered by receipt of a lagging TIMER signal falling edge. In steady state operation, the second edges of the TIMER and PWM signals will be aligned, and the UP and DOWN signals will both be generally inactive (low) apart from intermittent glitches. Any change in the duty cycle of the PWM signal, however, will be detected by the circuit 100, in which case the first and second phase detector output signals UP and DOWN are generated according to any phase difference between the falling edges of the PWM and TIMER signals.

The charge pump circuit 130 selectively sources or sinks current to or from a capacitor C1 according to the UP and DOWN signals to establish the voltage control signal VCTRL at the multivibrator control input 112. The multivibrator 110 provides a feedback path according to the voltage control signal VCTRL to adjust the duration of the TIMER pulses in order to align the second edges of the TIMER and PWM signals. The charge pump circuit 130 includes a first switching circuit 134 that operates when the UP signal is high to connect a first current source 131 to the control input 112 to source a first current I1 to the capacitor C1. The current source 131 is connected between a first analog supply reference voltage VDDA and the switching circuit 134. A second switching circuit 136 selectively connects a second current source 132 to the control input 112 to sink a second current (e.g., also I1 in this example) from the capacitor C1 when the second phase detector output signal DOWN is high. The second current source 132 is connected between the switching circuit 136 and a second analog supply reference voltage VSSA. The first and second currents are equal in one example, both having a value labeled I1 in FIG. 1.

An output circuit 140 provides the status output signal SS at the output 142 in a first state (high) when neither of the first and second phase detector output signals UP, DOWN is in the first state (high). When one of the first and second phase detector output signals UP or DOWN is active (high), the output circuit 140 provides the status output signal SS in a second state (low) indicating a transient event in the associated switching converter. The output circuit 140 in FIG. 1 filters the UP and DOWN signals to generate the status output signal SS. A first low pass filter circuit is formed by a resistor RF1 and a capacitor CF1 chosen to have a time constant of a few nanoseconds in one example. The first filter circuit RF1, CF1 receives the UP signal from the phase detector output 128A and includes an output 144 to provide a first filtered output signal TR+ having a first state (high) when the first phase detector output signal UP is high for a sufficient amount of time. The output circuit 140 also includes a second low pass filter circuit RF2, CF2, including an input coupled with the phase detector output 128B to receive the second phase detector output signal DOWN. An output 146 of the second filter circuit provides a second filtered output signal TR− having a first state (high) when the second phase detector output signal DOWN is high for a sufficient amount of time according to the time constant of the filter circuit RF2, CF2. The output circuit 140 in this example also includes a NOR gate 141 with a first input coupled with the output 144 of the first low pass filter circuit RF1, CF1 and a second input coupled with the output 146 of the second low pass filter circuit RF2, CF2. The output 142 of the NOR gate provides the status output signal SS in the first state (high) when neither of the signals TR+, TR− is high to indicate steady state operation of the associated switching converter. The NOR gate 141 provides the status output signal SS in a second state (low) indicating a transient event in the switching converter when one of the first and second filtered output signals TR+, TR− is high.

Figure 2:
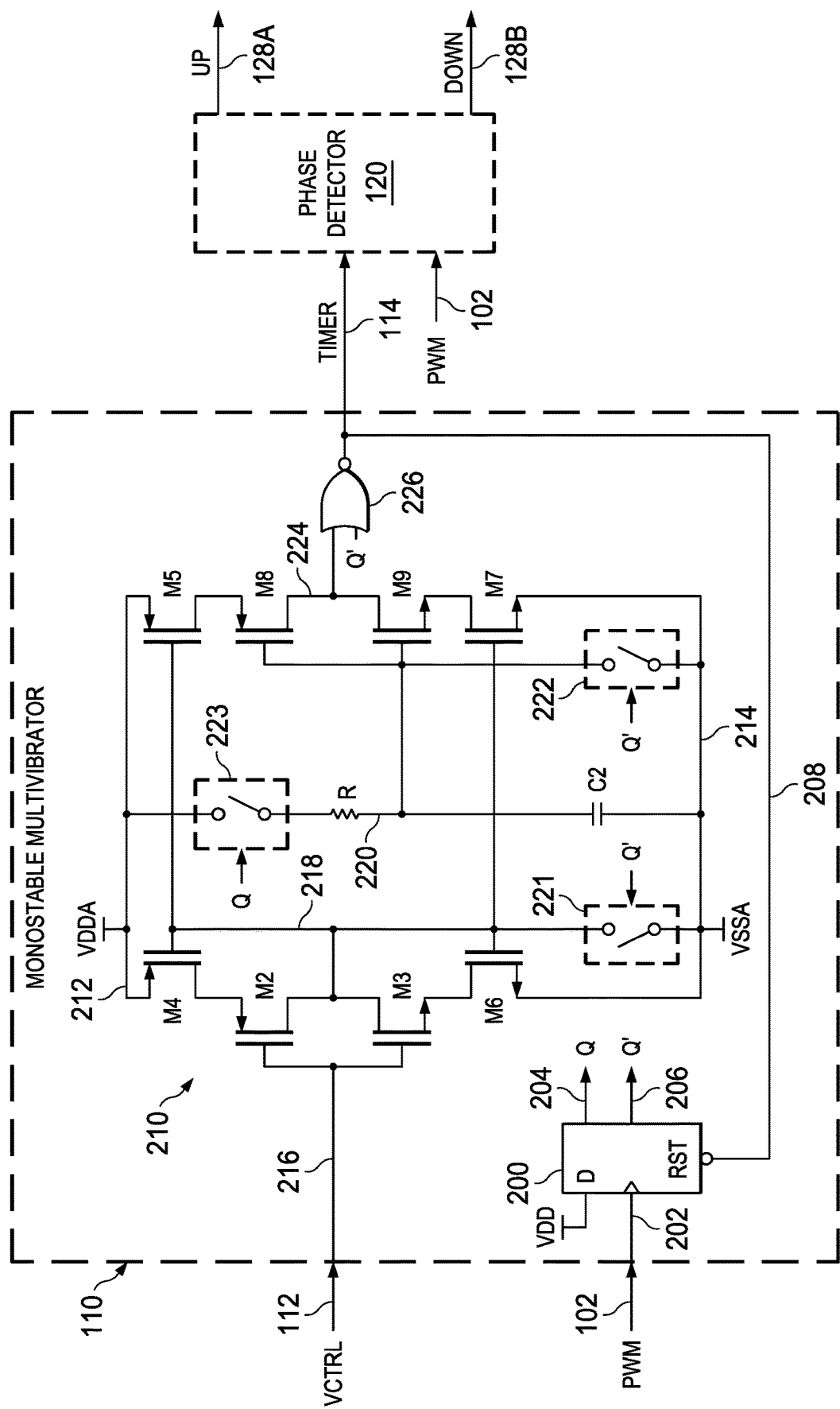
FIG. 2 is a schematic diagram of a monostable multivibrator in the DLL of FIG. 1.

FIG. 2 shows an example monostable multivibrator circuit 110 which can be used in the transient event detector circuit 100 of FIG. 1. The multivibrator circuit 110 includes a D flip-flop 200 with a clock input 202 that receives the PWM signal from the transient detector input 102. The flip-flop 200 provides a normal data output signal "Q" at an output 204, and an inverted output "Q'" at a second output 206. A reset input (RST) of the flip-flop 200 is driven by the TIMER signal on line 208 from the output 114 of the monostable multivibrator circuit 110. The circuit 110 also includes a comparator circuit 210 connected between the analog supply voltage node VDDA at line 212 and the second analog supply VSSA at line 214. The control voltage signal VCTRL is provided to a first comparator input 216. A CMOS input stage including transistors M2 and M3 receives the voltage control signal VCTRL, and the corresponding CMOS circuit output node 218 is connected to gate terminals of PMOS transistors M4 and M5 and to the gates of NMOS transistors M6 and M7. A first switch 221 is connected between the node 218 and VSSA and operates according to the Q' signal to reset the control input side of the comparator circuit 210. The comparator circuit 210 includes a second input node 220 connected to VDDA through a switch 223 and a resistor R. The switch 223 operates according to the Q signal from the flip-flop 200 to selectively deliver charging current to the second input node 220. A multivibrator capacitor C2 is connected between the second input node 220 and VSSA to control the voltage at the node 220. A switch 222 is connected between the node 220 and VSSA in parallel with the capacitor C2. The switch 222 operates according to the Q' signal to discharge the capacitor C2 to reset the voltage at the second input node 220. The voltage across C2 is provided as a gate control signal to a CMOS output formed by a PMOS transistor M8 and an NMOS transistor M9 connected between M5 and M7. The output transistor pair M8 and M9 have drains connected to an output node 224 that provides an input signal to a NOR gate 226. The Q' signal is provided to the other input of the gate 226, and the output of the gate 226 provides the TIMER signal at the multivibrator output 114.

After the comparator circuit 210 is reset by the switches 221 and 222, the next rising edge of the signal PWM causes the flip-flop Q signal to go high, and the Q' signal to go low. In this state, the switch 223 allows current flow through the resistor R to charge the capacitor C2 until the voltage at the node 220 turns on M9 to bring the voltage at the NOR gate input 224 low. The output of the NOR gate 226 goes high, causing a rising edge in the TIMER signal at the multivibrator output 114. The high state of the TIMER signal resets the flip-flop 200, causing the Q signal to again go low, and the Q' signal to go high. This resets the comparator circuit 210 by closing the switches 221 and 222, and opening the switch 223. The multivibrator circuit 110 controls the pulse width of the TIMER output signal according to the level of the voltage control signal VCTRL. In closed loop operation of the DLL circuit of FIG. 1, reducing the voltage control signal VCTRL reduces the TIMER signal pulse width or pulse duration because less time is required to charge the capacitor C2 to the corresponding level set by VCTRL in the multivibrator circuit 110. Conversely, increasing VCTRL allows the capacitor C2 to charge for a longer time, and thus increases the duration of the TIMER signal pulses.

The example circuit 100 of FIGS. 1 and 2 compares falling edges of the TIMER and PWM signals. In other examples, rising edge comparisons can be used by a corresponding phase detector circuit 120. In other examples, a phase comparator can compare a rising edge of one of the signals TIMER, PWM with a falling edge of the other signal in order to selectively provide an output signal based on a phase difference between the compared edges. The circuit 100 in FIG. 1 uses a voltage controlled monostable multivibrator circuit 110 and a feedback loop to implement a DLL in which the output of the variable monostable circuit 110 tracks the duty cycle of the PWM signal. The status signal SS can be used by a host circuit to identify changes in the PWM signal duty cycle, and thereby detect load or line transient events in a corresponding switching converter. In this example, if the switching converter reacts to a transient event through normal close loop PWM regulation of its output signal, the duty cycle of the corresponding PWM signal will change, and this duty cycle change is reflected by either the UP or the DOWN signal within the same PWM control cycle during which the transient event occurred. In certain implementations, the DLL circuit 110, 120, 130 has a bandwidth equal to the bandwidth of a control circuit operating the corresponding switching converter. This enhances transient event detection by ensuring that the controlled switching converter and the DLL become similarly over-slewed for the same type of detectable transient events.

Figure 3:
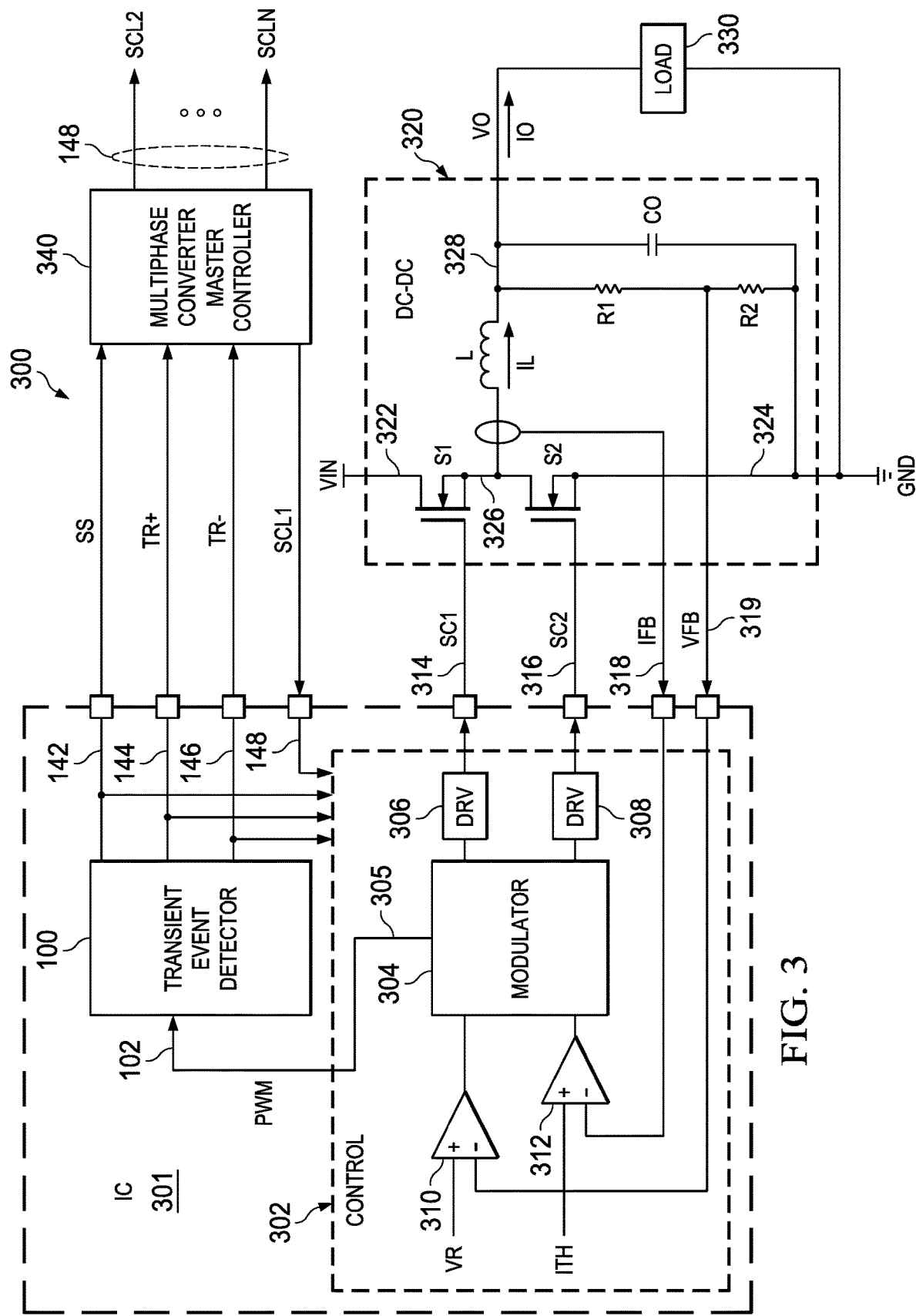
FIG. 3 is a schematic diagram of a switching converter controller IC with a transient event detector circuit in a multiphase power conversion system.

FIG. 3 shows an example power conversion system 300 in which the transient event detector circuit 100 can be used in combination with a controlled DC-DC switching converter 320 and an associated converter control circuit 302. As seen above, a host system can use the status signal SS to create a transient event flag to initiate appropriate responsive action in the system 300. In addition, the TR+ and TR− signals provided at the circuit outputs 144 and 146 can also be used to distinguish between positive and negative transient events. In the example of FIG. 3, an integer number N DC-DC switching converters 320 are used to drive a single load 330 with a regulated output voltage VO, where N is greater than 1. A multiphase converter master controller circuit 340 uses the SS, TR+ and TR− signals to selectively enable or disable certain of the switching converters 320 using corresponding slave control signals SCL1, SCL2, . . . , SCLN. In this example, the control circuit 302 that operates one of the DC-DC switching converters 320 is included along with the transient event detector circuit 100 in a single integrated circuit (IC) 301. The circuit 100 of FIG. 1 can be used in combination with a variety of different DC-DC converter systems. FIG. 3 shows an example multiphase buck DC-DC converter system 300 with a DC-DC converter circuit 320, and the system 300 includes one or more additional converter circuits 320 (not shown in FIG. 3).

The system 300 includes a PWM controller integrated circuit (IC) 301 with a transient event detector circuit 100 as described above that receives a PWM signal at an input 102 from the control circuit 302, and provides the signals SS, TR+ and TR− to the master controller 340. The control circuit 302 implements closed loop voltage control of the output voltage VO to deliver current IO to a load 330. The control circuit 302 in this example includes a modulator circuit 304 that generates the pulse width modulation signal PWM according to one or more feedback signals IFB, VFB to regulate the output voltage signal VO by generating switching control signal SC1 and SC2 according to the signal PWM. In the illustrated buck converter example, the modulator 304 generates the first switching control signal SC1 by providing a signal to a first driver circuit 306 generally according to the PWM signal, and generates the low side switching control signal SC2 via a second driver circuit 308 according to the inverse of the PWM signal. The drivers 306 and 308 respectively provide first and second switching control signals SC1 and SC2 at IC outputs 314 and 316 to operate high and low side switches S1 and S2 of the DC-DC switching converter 320. The modulator circuit 304 includes an output 305 that provides the PWM signal to the input 102 of the transient detector circuit 100 as described above. The control circuit 302 includes a first comparator 310 that compares a voltage reference signal VR to a feedback voltage signal VFB from an IC input 319 for regulating the output voltage VO of the DC-DC converter 320. In addition, a second comparator 312 compares a current threshold ITH with a current feedback signal IFB received at an IC input 318 from the DC-DC converter circuit 320. The DC-DC converter switching devices S1 and S2 operate according to the switching control signals SC1 and SC2 to convert DC input voltage VIN to provide a controlled DC output voltage VO to drive the load 330.

The first or high side converter switching device S1 is coupled between an input voltage node 322 and a switching node 326. The second switching device S2 is connected between the switching node 326 and an output reference voltage node 324 (labeled GND in the drawing). An output inductor L is connected between the switching node 326 and an output node 328. An output capacitor CO is connected between the output node 328 and the reference voltage node 324. A resistive divider network provides the voltage feedback signal VFB to the comparator 310 as a voltage in a node joining resistors R1 and R2 connected in series with one another in parallel with the output capacitor CO. In operation, the control circuit 302 provides alternating pulse width modulated switching control signals SC1 and SC2 in order to turn on S1 and magnetize the inductor L, and then to turn S1 off while turning on S2 in CCM operation for relatively high output current requirements. The inductor L conducts current IL from the switching node 326 to charge the output capacitor CO. Turning on S2 allows current to flow through the inductor L and the output capacitor CO, with the alternate operation of S1 and S2 maintaining a regulating the output voltage VO across the capacitor CO. A current sensor senses the inductor current IL to provide the current feedback signal IFB to the IC input 318 for comparison with a threshold ITH via the comparator 312. Controlled operation of the converter circuit 320 drives the load 330 with output current IO.

Figure 4:
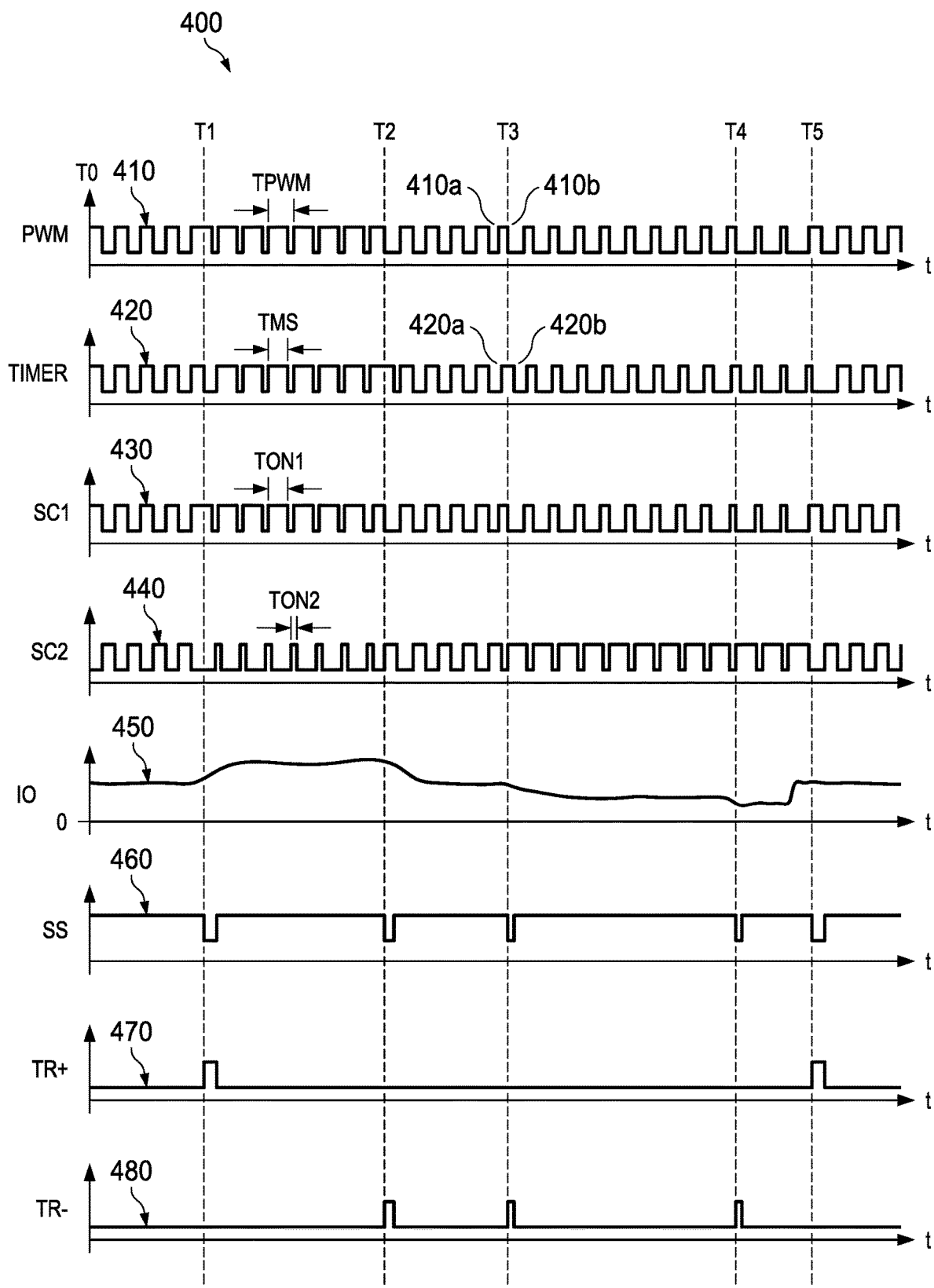
FIG. 4 is a waveform diagram showing various signals in the circuits of FIGS. 1-3.

Referring also to FIG. 4, a waveform diagram 400 illustrates various signals in the DC-DC converter system 300 of FIG. 3 and the transient event detector circuit 100 of FIG. 1. The PWM signal is shown as curve 410 including a first (e.g., rising) edge 410a and a second (falling) edge 410b. In this example, the PWM signal begins with a rising edge in each of a series of PWM cycles having a cycle period TPWM. The monostable multivibrator output pulse signal TIMER is shown as curve 420 including a first (e.g., rising) edge 420a triggered by the first edge 410a of the pulse with modulation signal PWM, and a second (falling) edge 420b controlled by the multivibrator circuit 110 to set the pulse duration TMS of the pulse output signal TIMER according to the voltage control signal VCTRL. Curves 430 and 440 respectively show the first and second switching control signals SC1 and SC2 in the switching converter 320. In this example, an output load current requirement of the switching converter 320 is shown as a curve 450 that varies as a function of time t. A curve 460 shows the status output signal SS remaining in the first state (high) and providing low going pulses at times T1, T2, T3, T4 and T5 based on the circuit 100 detecting transient events according to duty cycle changes in the PWM signal. The positive transient event signal TR+ is shown as curve 470 and the negative transient event signal TR− is shown as curve 480.

Between the illustrated times T0 and T1, the output current IO requirement curve 450 is generally constant, and the PWM signal curve 410 accordingly provides a generally constant duty cycle (e.g., approximately 50% in this example). The TIMER signal curve 420 generally tracks the PWM signal curve 410 in the steady state operation between T0 and T1, and the switching control signal curves 430 and 440 generally track the PWM signal 410 by operation of the control circuit 302. Just prior to T1, the output current requirement curve 450 increases, causing the control circuit 302 to extend the duty cycle of the PWM signal. At T1, the circuit 100 detects that the falling edge of the PWM signal lags the falling edge of the TIMER signal, causing assertion of the UP signal at the phase detector output 128A (FIG. 1). The output circuit 140 filters the UP signal, and the resulting filtered signal is provided as a high-going pulse in the TR+ signal curve 470. This TR+ signal pulse switches the output of the NOR gate 141, which provides a low-going pulse in the status output signal SS in curve 460. The output current requirement curve 450 remains generally high between T1 and T2, and the closed loop operation of the switching converter control circuit 302 controls the on-time TON1 of the first switching device S1 and the on-time TON2 of S2 according to the PWM signal curve 410.

At time T2, the output current requirement IO decreases, causing a corresponding decrease in the PWM signal duty cycle by operation of the control circuit 302. The phase detector circuit 120 asserts the DOWN signal in response to detection of the falling edge 410b of the PWM signal leading the falling edge 420b of the TIMER signal. This creates a high-going pulse in the DOWN signal, which is filtered and provided as a high-going pulse in the TR− curve 480. The TR− pulse switches the NOR gate output 142 which provides another low-going pulse in the SS signal curve 460 to indicate detection of a transient condition in the power converter 320. A further decrease in the output current requirement at T3 causes the transient event detector circuit 100 to generate another low-going pulse in the SS curve 460 and a corresponding high-going pulse in the TR− curve 480. In this example, the current requirement undergoes a further decrease at T4, leading to further pulses in the SS and TR− curves 460 and 480, respectively. Prior to time T5 in FIG. 4, the output load current requirement increases, which causes a further phase difference between the PWM and TIMER signals. In this increasing load current instance, the falling edge of the TIMER signal leads the corresponding falling edge of the PWM signal, and the transient detector circuit 100 generates a low-going pulse in the SS signal curve 460 along with a corresponding high-going pulse in the TR+ curve 470.

As seen above, the transient event detector circuit 100 advantageously provides one or more signals SS, TR+, TR− to indicate to a host system the occurrence of a transient event associated with a switching converter 320. In addition, the circuit 100 provides fast detection of transient events, and provides the signals SS, TR+, TR− in the same PWM switching cycle during which the transient event occur. This is a significant advance over other solutions that used comparators and differentiators created using op amp circuits to differentiate the output voltage to detect the transient event. Presently disclosed examples provide significant transient detection speed improvement, and certain implementations can detect transient events within a few nanoseconds representing gate delays of a few gates in the phase detector circuit 120. In addition, the disclosed circuits 100 provide a low power detection solution which cannot be achieved using high-speed differentiating op amp circuitry to achieve the detection speed while using a reasonable amount of current.

Figure 5:
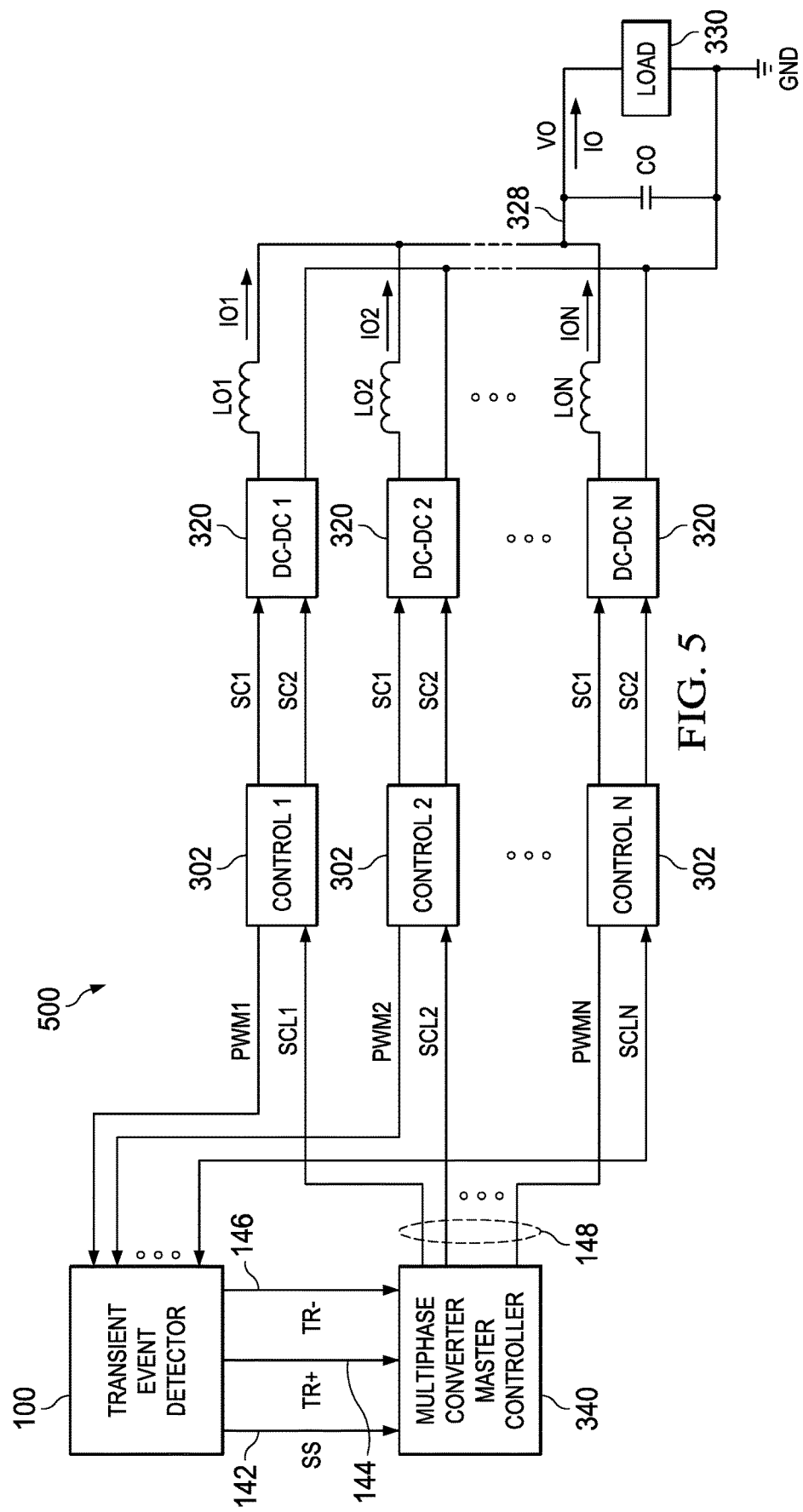
FIG. 5 is a system diagram of a multiphase power conversion system with a transient event detector providing signals to a master controller.
Figure 6:
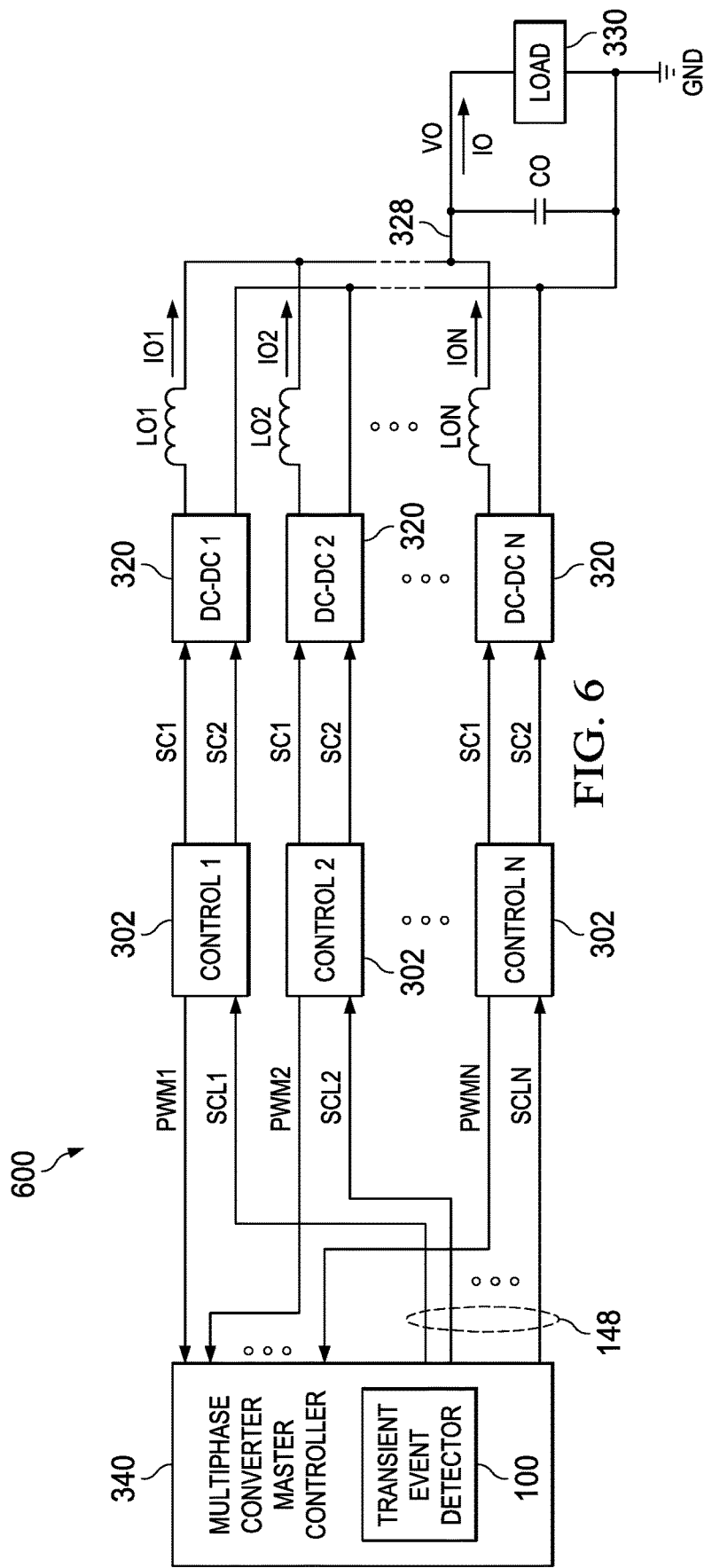
FIG. 6 is a system diagram of a multiphase power conversion system with a master controller including a transient event detector circuit.

Referring also to FIGS. 5 and 6, the transient event detector circuit 100 can be employed in any form of switching converter system, and can advantageously be incorporated into a master controller and/or a PWM control chip or IC. As noted above in FIG. 3, one possible implementation includes a switching converter control chip 301 having a control circuit 302 for operating an associated switching converter circuit 320, as well as an on-board transient event detector that consumes the PWM signal from the control circuit 302 and generates one or more of the signals SS, TR+, TR− for internal use or for use by an external multiphase converter master controller 340. The master controller 340, in turn, can selectively control activation states (e.g., enabled or disabled) of one or more converter circuits 320 in a multiphase power conversion system. FIG. 5 shows another example of a multiphase DC-DC power conversion system 500, including an integer number N DC-DC switching converter circuits 320, each connected by a corresponding output inductor LO1, LO2, . . . , LON to provide (when enabled) a corresponding output current IO1, IO2, . . . , ION to drive a shared load 330. In this example, the individual switching converter circuits 320 receive switching control signals SC1 and SC2 from a corresponding control circuit 302. The individual converter systems, referred to herein as "phases" are individually enabled by a corresponding slave control signal SCL1, SCL2, . . . , SCLN from a multiphase converter master controller circuit 340. The master controller 340 in this case includes an integer number N outputs 148 to provide the slave control signals SCL to the individual control circuits 302. In one example, the slave control signals SCL are 2-state signals causing the corresponding controller 302 to enable or disable operation of the corresponding switching converter 320. The individual control circuits 302 in this case provide their corresponding PWM signals PWM1, PWM2, . . . PWMN to a transient event detector circuit 100 as described above. In one example, the transient event detector circuit 100, the control circuits 302 are stand-alone converter control ICs, and the master controller 340 is a separate IC. In this case, the transient event detector circuit IC 100 is connected in a given implementation to the control circuits 302 and to the master controller 340 by appropriate circuit board connections (not shown). FIG. 6 shows another system 600 in which the transient event detector circuit 100 and the master controller 340 are included in a single integrated circuit implementation. In another alternate implementation, the master controller circuitry 340, the transient event detector circuit 100 and the single or multiple converter control circuits 302 can be provided in a single multiphase controller IC.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. A circuit comprising:
a monostable multivibrator circuit configured to generate a pulse output signal based on a pulse width modulation signal and a control signal;
a phase detector circuit configured to generate first and second phase detector output signals based on a phase difference between corresponding edges of the pulse output signal and the pulse with modulation signal; and
a charge pump circuit configured to increase the control signal when the first phase detector output signal is asserted, and to decrease the control signal when the second phase detector output signal is asserted.

2. The circuit of claim 1, wherein:
the pulse output signal includes a first edge triggered by a first edge of the pulse width modulation signal, and a second edge following the first edge of the pulse output signal;
the pulse width modulation signal includes a second edge following the first edge of the pulse width modulation signal; and
the corresponding edges include the second edge of the pulse output signal and the second edge of the pulse width modulation signal.

3. The circuit of claim 1, wherein the charge pump circuit includes:
a control node coupled to provide the control signal to the monostable multivibrator circuit;
a charging path configured to increase a voltage of the control node when the first phase detector output signal is asserted; and
a discharging path configured to decrease the voltage of the control node when the second phase detector output signal is asserted.

4. The circuit of claim 1, wherein:
the charge pump circuit includes a capacitor coupled to the control node and parallel to the discharge path;
the charging path includes a first current source, and a first switch coupled between the first current source and the capacitor, the first switch controlled by the first phase detector output signal; and
the discharging path includes a second current source, and a second switch coupled between the second current source and the capacitor, the second switch controlled by the second phase detector output signal.

5. The circuit of claim 1, further comprising:
an output circuit configured to assert a first state of a status output signal when neither the first nor second phase detector output signal is asserted, and to assert a second state of the status output signal when either one of the first or second phase detector output signal is asserted.

6. The circuit of claim 1, wherein the phase detector circuit includes:
a flip-flop having:
an input terminal coupled to a voltage supply terminal;
a clock terminal coupled to receive an inverted version of the pulse output signal;

an output terminal configured to deliver the first phase detector output signal; and
a reset terminal; and
a NAND gate having an input coupled to the output terminal, and an output coupled to the reset terminal.

7. The circuit of claim 1, wherein the phase detector circuit includes:
a flip-flop having:
an input terminal coupled to a voltage supply terminal;
a clock terminal coupled to receive an inverted version of the pulse width modulation signal;
an output terminal configured to deliver the second phase detector output signal; and
a reset terminal; and
a NAND gate having an input coupled to the output terminal, and an output coupled to the reset terminal.

8. The circuit of claim 1, wherein the phase detector circuit includes:
a first flip-flop having a first clock terminal coupled to receive a delayed version of the pulse output signal, a first output terminal configured to deliver the first phase detector output signal, and a first reset terminal;
a second flip-flop having a second clock terminal coupled to receive a delayed version of the pulse width modulation signal, a second output terminal configured to deliver the second phase detector output signal, and a second reset terminal; and
a NAND gate having a first input coupled to the first output terminal, a second input coupled to the second output terminal, and an output coupled to the first and second reset terminals.

9. A power converter, comprising:
a first phase switching converter;
a second phase switching converter;
a master controller configured to selectively enable the second phase switching converter in conjunction with the first phase switching converter based on a transient detection signal; and
a transient detection circuit configured to generate the transient detection signal based on a detected change in duty cycles of a pulse width modulation signal for controlling the first and second phase switching converter.

10. The power converter of claim 9, wherein the transient detection circuit includes:
a monostable multivibrator circuit configured to generate a pulse output signal based on the pulse width modulation signal and a control signal;
a phase detector circuit configured to generate first and second phase detector output signals based on a phase difference between corresponding edges of the pulse output signal and the pulse with modulation signal;
a charge pump circuit configured to increase the control signal when the first phase detector output signal is asserted, and to decrease the control signal when the second phase detector output signal is asserted; and
an output circuit configured to generate the transient detection signal based on at least one of the first or second phase detector output signal.

11. The power converter of claim 10, wherein:
the pulse output signal includes a first edge triggered by a first edge of the pulse width modulation signal, and a second edge following the first edge of the pulse output signal;
the pulse width modulation signal includes a second edge following the first edge of the pulse width modulation signal; and
the corresponding edges include the second edge of the pulse output signal and the second edge of the pulse width modulation signal.

12. The power converter of claim 10, wherein the charge pump circuit includes:
a control node coupled to provide the control signal to the monostable multivibrator circuit;
a charging path configured to increase a voltage of the control node when the first phase detector output signal is asserted; and
a discharging path configured to decrease the voltage of the control node when the second phase detector output signal is asserted.

13. The power converter of claim 10, wherein the phase detector circuit includes:
a flip-flop having:
an input terminal coupled to a voltage supply terminal;
a clock terminal coupled to receive an inverted version of the pulse output signal;
an output terminal configured to deliver the first phase detector output signal; and
a reset terminal; and
a NAND gate having an input coupled to the output terminal, and an output coupled to the reset terminal.

14. The power converter of claim 10, wherein the phase detector circuit includes:
a flip-flop having:
an input terminal coupled to a voltage supply terminal;
a clock terminal coupled to receive an inverted version of the pulse width modulation signal;
an output terminal configured to deliver the second phase detector output signal; and
a reset terminal; and
a NAND gate having an input coupled to the output terminal, and an output coupled to the reset terminal.

15. The power converter of claim 10, wherein the phase detector circuit includes:
a first flip-flop having a first clock terminal coupled to receive a delayed version of the pulse output signal, a first output terminal configured to deliver the first phase detector output signal, and a first reset terminal;
a second flip-flop having a second clock terminal coupled to receive a delayed version of the pulse width modulation signal, a second output terminal configured to deliver the second phase detector output signal, and a second reset terminal; and
NAND gate having a first input coupled to the first output terminal, a second input coupled to the second output terminal, and an output coupled to the first and second reset terminals.

16. A power converter, comprising:
a first phase switching converter;
a second phase switching converter;
a master controller configured to enable at least one of the first or second phase switching converter based on a transient detection signal; and
a transient detection circuit including:
a monostable multivibrator circuit configured to generate a pulse output signal based on the pulse width modulation signal and a control signal;
a phase detector circuit configured to generate first and second phase detector output signals based on a phase difference between corresponding edges of the pulse output signal and the pulse with modulation signal;
a charge pump circuit configured to increase the control signal when the first phase detector output signal is asserted, and to decrease the control signal when the second phase detector output signal is asserted; and an output circuit configured to generate the transient detection signal based on at least one of the first or second phase detector output signal.

17. The power converter of claim 16, wherein:

the pulse output signal includes a first edge triggered by a first edge of the pulse width modulation signal, and a second edge following the first edge of the pulse output signal;

the pulse width modulation signal includes a second edge following the first edge of the pulse width modulation signal; and the corresponding edges include the second edge of the pulse output signal and the second edge of the pulse width modulation signal.

18. The power converter of claim 16, wherein the charge pump circuit includes:

a control node coupled to provide the control signal to the monostable multivibrator circuit;

a charging path configured to increase a voltage of the control node when the first phase detector output signal is asserted; and a discharging path configured to decrease the voltage of the control node when the second phase detector output signal is asserted.

19. The power converter of claim 16, wherein the phase detector circuit includes:

a flip-flop having:
   an input terminal coupled to a voltage supply terminal;
   a clock terminal coupled to receive an inverted version of the pulse output signal;
   an output terminal configured to deliver the first phase detector output signal; and
   a reset terminal; and a NAND gate having an input coupled to the output terminal, and an output coupled to the reset terminal.

20. The power converter of claim 16, wherein the phase detector circuit includes:

a flip-flop having:
   an input terminal coupled to a voltage supply terminal;
   a clock terminal coupled to receive an inverted version of the pulse width modulation signal;
   an output terminal configured to deliver the second phase detector output signal; and
   a reset terminal; and a NAND gate having an input coupled to the output terminal, and an output coupled to the reset terminal.

* * * * *